US006432218B1

(12) United States Patent
Hirokawa et al.

(10) Patent No.: US 6,432,218 B1
(45) Date of Patent: Aug. 13, 2002

(54) MULTI-STEP FLOW CLEANING METHOD AND MULTI-STEP FLOW CLEANING APPARATUS

(75) Inventors: Masatoshi Hirokawa; Haruki Sonoda; Yusuke Abe; Tetsuji Oishi; Masashi Omori, all of Shizuoka-Ken; Hiroshi Tanaka, Tokyo, all of (JP)

(73) Assignee: SPC Electronics Corporation, Tokyo (JP)

(*) Notice: Subject to any disclaimer, the term of this patent is extended or adjusted under 35 U.S.C. 154(b) by 0 days.

(21) Appl. No.: 09/402,877

(22) PCT Filed: Dec. 18, 1998

(86) PCT No.: PCT/JP98/05751

§ 371 (c)(1),
(2), (4) Date: Dec. 7, 1999

(87) PCT Pub. No.: WO99/42227

PCT Pub. Date: Aug. 26, 1999

(30) Foreign Application Priority Data

Feb. 18, 1998 (JP) .......................................... 10-036310

(51) Int. Cl.[7] .......................... B08B 3/10; H01L 21/304
(52) U.S. Cl. .............................. 134/34; 134/2; 134/902
(58) Field of Search ................................ 134/2, 10, 18, 134/221, 24, 34, 902; 137/50, 51, 54, 111, 112, 115.01, 247.17, 813, 814, 816, 818, 821, 825, 829, 830, 831, 832

(56) References Cited

U.S. PATENT DOCUMENTS 3,749,110 A * 7/1973 Daniels et al. ................ 137/92
3,757,806 A * 9/1973 Bhaskar et al. ............. 134/191
4,059,128 A * 11/1977 Heske et al. ............. 137/487.5
4,397,505 A * 8/1983 Linkner, Jr. ..................... 303/9
4,997,490 A * 3/1991 Vetter et al. .................. 134/26
5,467,789 A * 11/1995 Takahashi et al. ............ 134/56
5,651,836 A * 7/1997 Suzuki ........................ 134/34
5,855,792 A * 1/1999 Adams et al. .............. 210/696
5,881,748 A * 3/1999 Suzuki ....................... 134/155
5,948,173 A * 9/1999 Huh et al. .................... 134/34

* cited by examiner

*Primary Examiner*—Randy Gulakowski
*Assistant Examiner*—J Smetana
(74) *Attorney, Agent, or Firm*—Trop, Pruner & Hu, P.C.

(57) ABSTRACT

A multi-step flow cleaning method and a multi-step flow cleaning apparatus are provided which effectively clean workpieces with a stream of a cleaning solution and to suppress an increase of foreign matters adhering to the surfaces of the workpieces. A cleaning tank 10 for holding workpieces is provided, a supply line 14 for supplying a cleaning solution such as pure water from the bottom surface of the cleaning tank is provided, and a valve 12 for adjusting the flow of the cleaning solution is disposed in the middle of the supply line 14. The valve 12 is equipped with a switching section 12*a* for controlling the outflow of the cleaning solution by opening or closing the supply line 14, and a bypass 12*b* for supplying the cleaning solution, bypassing the switching section 12*a*. The valve 12 is provided such that it is able to adjust in two steps the supply flow of the cleaning solution supplied to the cleaning tank 10 by using the supply flow fed through the bypass 12*b* and the supply flow fed through the switching section 12*a*.

4 Claims, 7 Drawing Sheets

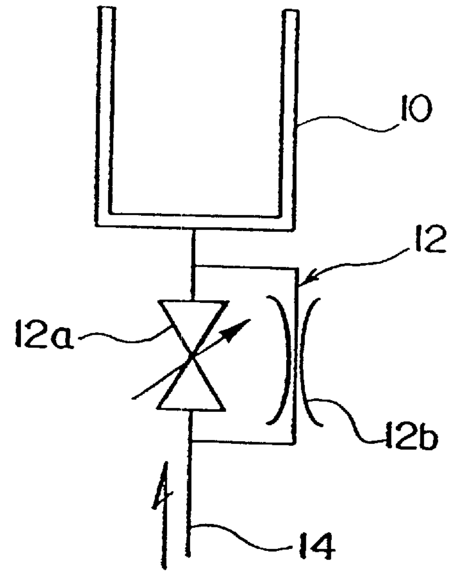
[FIG.1]
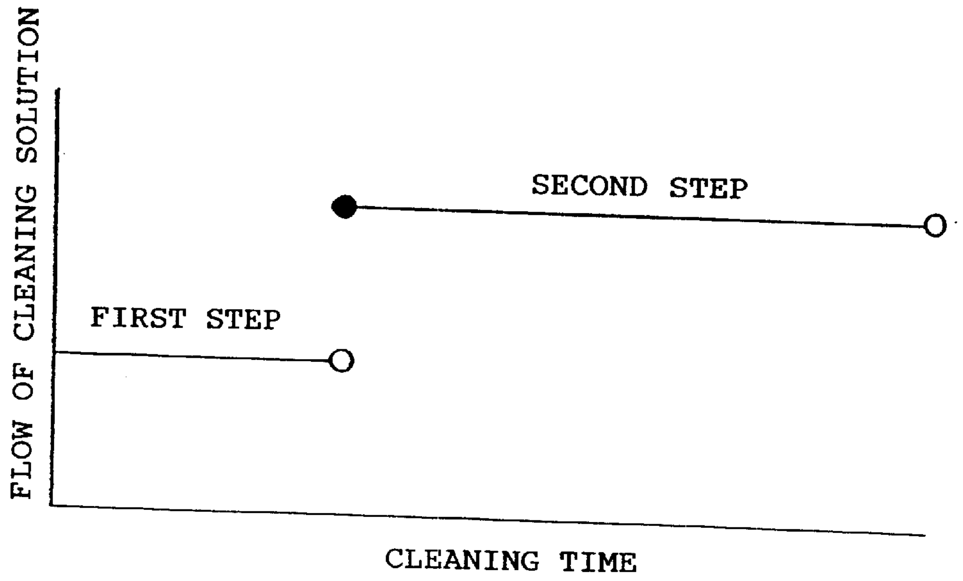
[FIG.2]

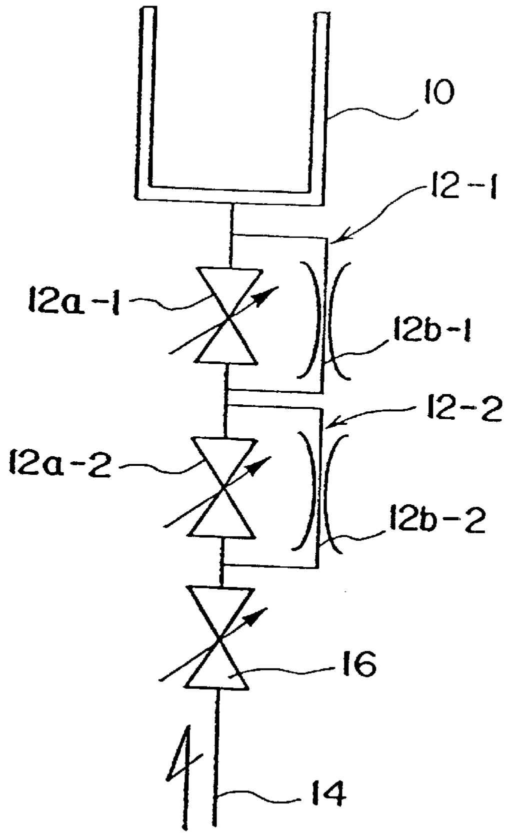
[FIG.3]
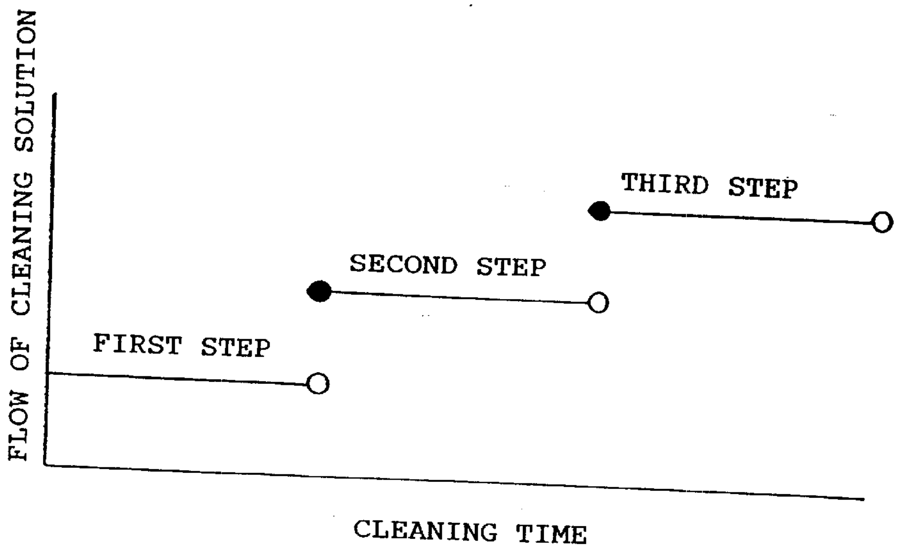
[FIG.4]

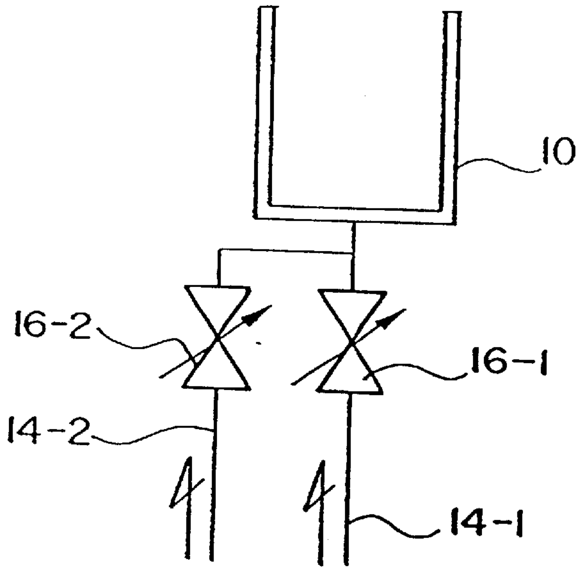
[FIG.5]
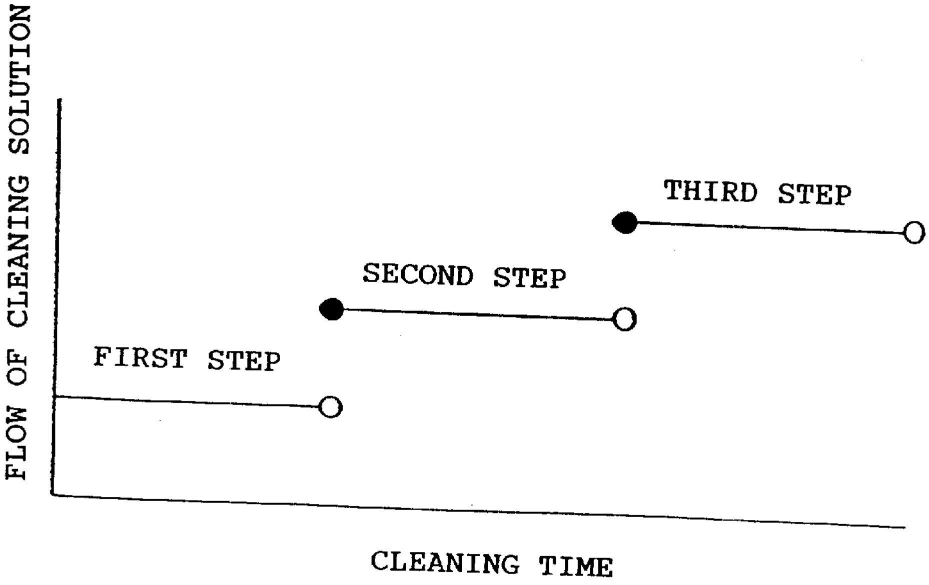
[FIG.6]

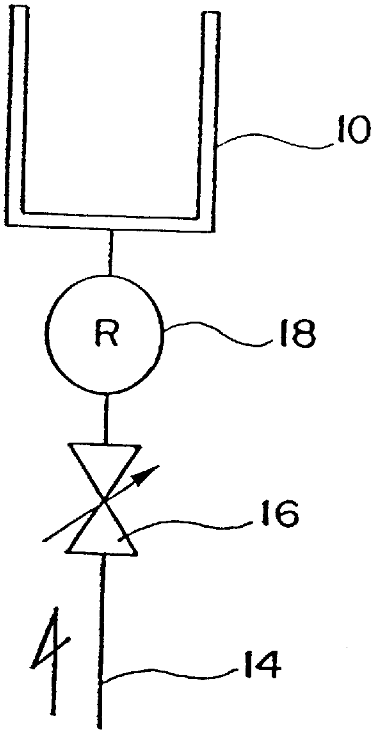
[FIG.7]
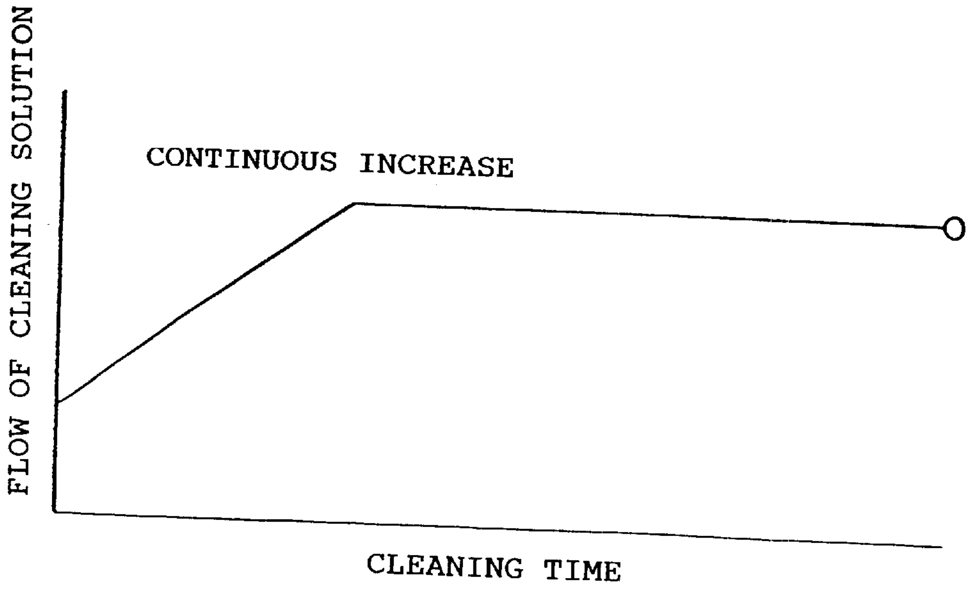
[FIG.8]

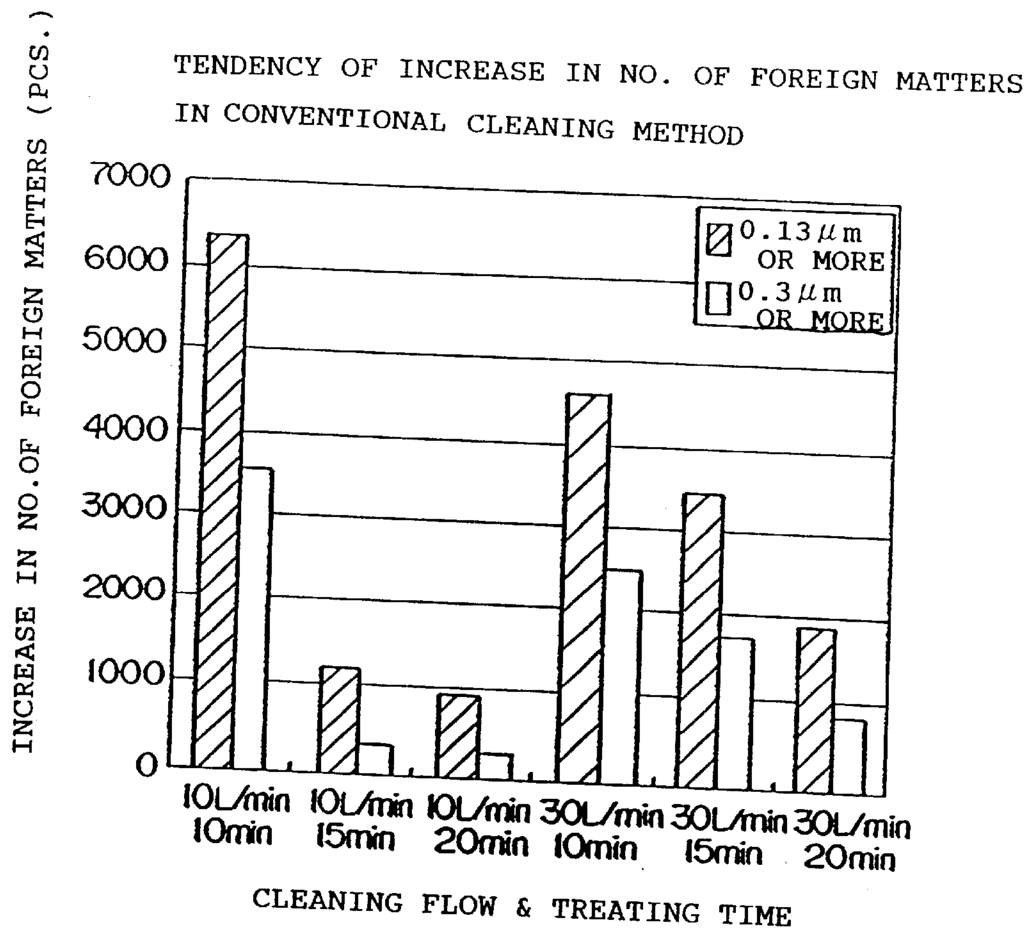
[FIG.9]

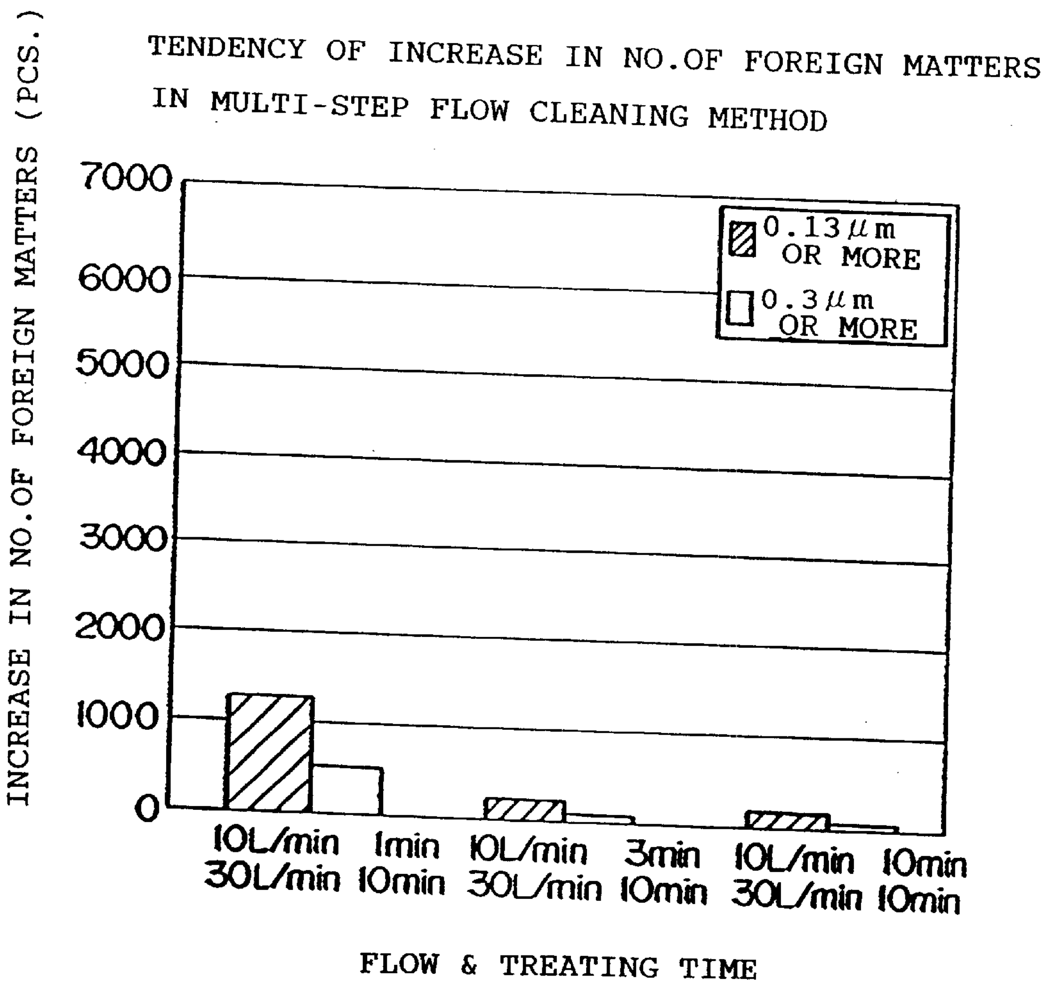
[FIG.10]

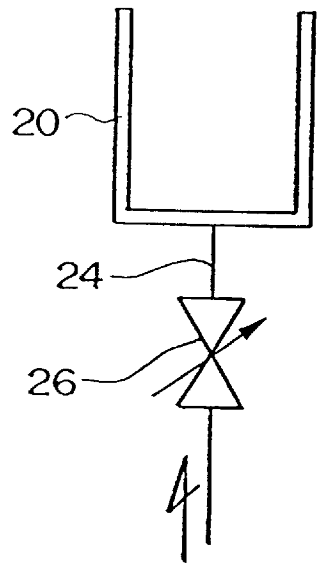
[FIG.11]
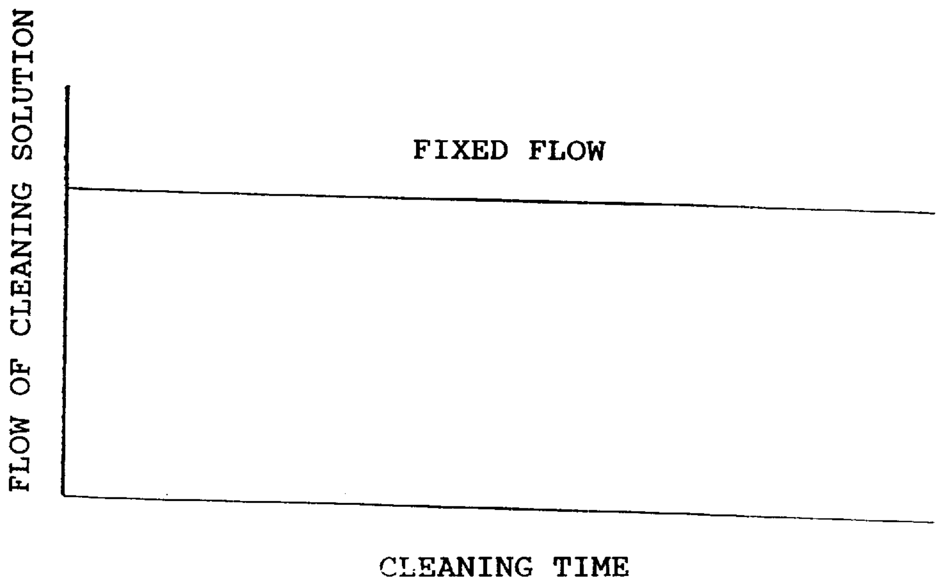
[FIG.12]

MULTI-STEP FLOW CLEANING METHOD AND MULTI-STEP FLOW CLEANING APPARATUS

FIELD OF THE INVENTION

The present invention relates to a multi-step flow cleaning method and a multi-step flow cleaning apparatus and, more particularly, to a multi-step flow cleaning method and a multi-step flow cleaning apparatus adapted to clean an workpiece by placing the workpiece, which has been treated with a chemical, in a cleaning tank and by supplying a cleaning solution thereby to clean the workpiece with the stream of the cleaning solution.

BACKGROUND ART

Hitherto, workpieces to be cleaned including semiconductor wafers, glass substrates, and electronic substrates are required to be subjected to a cleaning process for cleaning with a cleaning solution such as pure water to remove a chemical from the surfaces of the workpieces that have been subjected to a chemical treatment (etching). In this cleaning process, a cleaning apparatus is extensively used in which workpieces that have been subjected to the chemical treatment are placed, and a cleaning solution such as pure water is supplied from the bottom surface of the cleaning tank thereby to clean the workpieces by the stream of the cleaning solution.

FIG. 11 is a piping diagram showing the structure of a conventional cleaning apparatus adapted to clean workpieces with the stream of a cleaning solution by supplying the cleaning solution into the cleaning tank as described above.

As shown in FIG. 11, the conventional cleaning apparatus is provided with a cleaning tank 20 for holding workpieces (not shown) that have been treated with a chemical, a supply line 24 for supplying a cleaning solution such as pure water from the bottom surface of the cleaning tank 20, and a valve 22 connected at the middle of the supply line 24 to control the supply of the cleaning solution.

The valve 22 has a structure for opening or closing the supply line by electrically turning it ON or OFF. This enables the valve 22 to supply or interrupt the supply of the cleaning solution, which flows out through the supply line 24, to the cleaning tank 20.

When using the conventional cleaning apparatus, first, a plurality of workpieces, which have been subjected to a chemical treatment such as etching in a predetermined process, are placed in a cleaning cassette (not shown), and the cleaning cassette (not shown) is carried into the cleaning tank 20. When the cleaning cassette (not shown) has been carried into the cleaning tank 20, a cleaning solution such as pure water, which has been supplied through the supply line 24, is let flow into the cleaning tank 20 by opening the valve 22.

FIG. 12 is a graph showing changes in the flow of the cleaning solution supplied while the conventional cleaning apparatus shown in FIG. 11 is in the cleaning operation. As shown in FIG. 11, a constant flow of the cleaning solution is supplied into the cleaning tank 20 at all times until the cleaning is finished after the valve 22 is opened. The cleaning solution supplied in the constant flow flows into the cleaning cassette (not shown) placed in the cleaning tank 20 to clean the surfaces of the workpieces by the stream of the cleaning solution.

Thus, the conventional cleaning apparatus has been cleaning the surfaces of the workpieces held in the cleaning cassette (not shown) with the constant flow by supplying the constant stream of the cleaning solution through the supply line 24 connected to the bottom surface of the cleaning tank 20.

The conventional cleaning apparatus is capable of removing some foreign matters, which have adhered to the surfaces of the workpieces during the chemical treatment, by the stream of the cleaning solution supplied to the cleaning tank; however, the stream of the cleaning solution supplied in the constant flow is not good enough to remove some persistent foreign matters on the workpieces. Hence, it has been difficult for the conventional cleaning apparatus to remove the foreign matters, which have adhered during the chemical treatment process, to a satisfactory level.

Further, the conventional cleaning apparatus requires a large quantity of a cleaning solution and a long cleaning time in order to fully remove persistent foreign matters, which have adhered to the surfaces of workpieces during a chemical treatment process. Hence, it has been difficult to reduce a cleaning solution or shorten the cleaning time in implementing satisfactory cleaning of workpieces.

It is an object of the present invention to solve the problems described above and to provide a multi-step flow cleaning method and a multi-step flow cleaning apparatus that are capable of cleaning workpieces more effectively with the stream of a cleaning solution and also capable of suppressing an increase in foreign matters adhering to the surfaces of the workpieces.

DISCLOSURE OF THE INVENTION

To this end, according to one aspect of the present invention, there is provided a cleaning method by placing workpieces in a cleaning tank and by supplying a cleaning solution so as to clean the workpieces with a flow of the cleaning solution, wherein the flow of the cleaning solution supplied to the cleaning tank is adjusted to change the stream during a cleaning operation, thus cleaning the workpieces with the changing stream of the cleaning solution. In this case, the flow of the cleaning solution supplied to the cleaning tank is either changed from a small flow to a large flow in steps or continuously changed from a small flow to a large flow. Further, the supply flow of the cleaning solution is held small at least until the workpieces are fully immersed in the cleaning solution supplied to the cleaning tank.

According to another aspect of the present invention, there is provided a cleaning apparatus for cleaning workpieces by placing the workpieces in a cleaning tank and by providing the cleaning tank with a supply line to supply a cleaning solution so as to clean the workpieces with the stream of the cleaning solution, the cleaning apparatus being provided with a supply line for supplying the cleaning solution to the cleaning tank, and a flow adjusting means which is provided on the supply line and which adjusts the flow of the cleaning solution supplied to the cleaning tank, wherein the flow of the cleaning solution supplied to the cleaning tank is adjusted by the flow adjusting means to change the stream so as to clean the workpieces by the changing stream of the cleaning solution.

BRIEF DESCRIPTION OF THE DRAWINGS

FIG. 1 is a piping diagram showing the structure of a first embodiment of a multi-step flow cleaning apparatus in accordance with the present invention.

FIG. 2 is a graph illustrating the changes in the flow of a cleaning solution supplied while the multi-step flow cleaning apparatus shown in FIG. 1 is in a cleaning operation.

FIG. 3 is a piping diagram showing the structure of a second embodiment of a multi-step flow cleaning apparatus in accordance with the present invention.

FIG. 4 is a graph illustrating the changes in the flow of a cleaning solution supplied while the multi-step flow cleaning apparatus shown in FIG. 3 is in a cleaning operation.

FIG. 5 is a piping diagram showing the structure of a third embodiment of a multi-step flow cleaning apparatus in accordance with the present invention.

FIG. 6 is a graph illustrating the changes in the flow of a cleaning solution supplied while the multi-step flow cleaning apparatus shown in FIG. 5 is in a cleaning operation.

FIG. 7 is a piping diagram showing the structure of a fourth embodiment of a multi-step flow cleaning apparatus in accordance with the present invention.

FIG. 8 is a graph illustrating the changes in the flow of a cleaning solution supplied while the multi-step flow cleaning apparatus shown in FIG. 7 is in a cleaning operation.

FIG. 9 is a graph showing an increase in the number of foreign matters observed when a cleaning experiment has been carried out with a conventional cleaning apparatus shown in FIG. 11.

FIG. 10 is a graph showing an increase in the number of foreign matters observed when a cleaning experiment has been carried out with the multi-step flow cleaning apparatus in accordance with the present invention shown in FIG. 1.

FIG. 11 is a piping diagram showing the structure of the conventional cleaning apparatus.

FIG. 12 is a graph illustrating the changes in the flow of a cleaning solution supplied while the conventional cleaning apparatus shown in FIG. 11 is in a cleaning operation.

BEST MODE FOR CARRYING OUT THE INVENTION

The following will describe in detail the embodiments of a multi-step flow cleaning method and a multi-step flow cleaning apparatus in accordance with the present invention with reference to the accompanying drawings.

FIG. 1 is a piping diagram showing the structure of a first embodiment of a multi-step flow cleaning apparatus in accordance with the present invention. Further, FIG. 2 is a graph illustrating the changes in the flow of a cleaning solution supplied while the multi-step flow cleaning apparatus shown in FIG. 1 is in a cleaning operation.

As shown in FIG. 1, the first embodiment of the multi-step flow cleaning apparatus in accordance with the present invention is provided with a cleaning tank 10 for holding workpieces (not shown) that have undergone a chemical treatment, a supply line 14 connected to the bottom surface of the cleaning tank 10 to supply a cleaning solution such as pure water from outside, and an adjusting valve 12 disposed in the middle of the supply line 14 to adjust the flow of the cleaning solution such as pure water.

The adjusting valve 12 is provided with a switching section 12*a* for opening/closing the supply line 14 by being electrically turned ON/OFF, and a bypass 12*b* provided so that it bypasses the switching section 12*a*. Hence, unlike in the case of a conventional cleaning apparatus, the adjusting valve 12 is able to adjust the flow of a cleaning solution in two steps as time passes according to the supply flow through the switching section 12*a* and the supply flow through the bypass 12*b*.

When using the multi-step flow cleaning apparatus configured as described above, first, a plurality of workpieces are taken from a predetermined process and placed in a cleaning cassette (not shown), and the cleaning cassette (not shown) is carried into the cleaning tank 10. When the cleaning cassette (not shown) has been carried into the cleaning tank 10, a cleaning solution such as pure water is flown into the cleaning tank 10 through the supply line 14.

At this time, the switching section 12*a* of the adjusting valve 12 is held closed thereby to cause the cleaning solution, which has been supplied to the supply line 14, to flow into the cleaning tank 10 through the bypass 12*b*. The cleaning solution flown into the cleaning tank 10 moves from the bottom to top of the cleaning cassette (not shown) to clean the surfaces of the contained workpieces with the stream thereof.

After the workpieces have been cleaned for a given time by the cleaning solution supplied through the bypass 12*b*, the adjusting valve 12 opens the switching section 12*a* to supply the cleaning solution also through the switching section 12*a* in addition to the bypass 12*b*.

Thus, in the first embodiment, as shown in FIG. 2, the workpieces are cleaned with the stream of the cleaning solution supplied in a small flow through the bypass 12*b*, with the valve 12 closed in a first step. Then, after the cleaning operation of the workpieces in the first step has been carried out for a given time, the switching section 12*a* of the adjusting valve 12 is opened in a second step to supply the cleaning solution through the bypass 12*b* and the switching section 12*a* at the same time so as to clean the workpieces with a larger flow. Thus, the cleaning solution supplied into the cleaning tank 10 performs the cleaning operation of the workpieces, which have been placed in the cleaning tank 10, with the stream of the cleaning solution that is changed in two steps.

According to the first embodiment, therefore, the workpieces are cleaned with pure water flow in two steps based on lapse of time; hence, the foreign matters on the surfaces of the workpieces can be effectively removed, allowing a shortened cleaning time and a reduced quantity of cleaning solution to be achieved.

Referring now to FIG. 3 and FIG. 4, a second embodiment of the multi-step flow cleaning method and the multi-step flow cleaning apparatus in accordance with the present invention will be described in detail. FIG. 3 is a piping diagram showing the structure of the second embodiment of the multi-step flow cleaning apparatus in accordance with the present invention. FIG. 4 is a graph illustrating the changes in the flow of a cleaning solution supplied while the multi-step flow cleaning apparatus shown in FIG. 3 is in a cleaning operation. In the second embodiment, a plurality of the adjusting valves 12 in the first embodiment have been installed, and the same components will be assigned the same reference numerals, and the explanation thereof will not be repeated.

As shown in FIG. 3, the second embodiment of the multi-step flow cleaning apparatus in accordance with the present invention is provided with a cleaning tank 10 for holding workpieces, a supply line 14 for supplying a cleaning solution such as pure water, and a plurality of adjusting valves 12-1 and 12-2 disposed in series in the supply line 14, and a valve 16.

The valve 16 is provided so that it is electrically turned ON and OFF to open and close the supply line. The adjusting valves 12-1 and 12-2 are provided with a switching section 12*a* for opening and closing the supply line 14 by electrically turning it ON and OFF and a bypass 12*b* provided so that it bypasses the switching section 12*a*. Hence, the second embodiment is able to change the flow of a cleaning solution in a plurality of steps as time passes by the adjusting valves 12-1 and 12-2, and the valve 16.

When using the multi-step flow cleaning apparatus configured as described above, first, a plurality of workpieces are taken from a predetermined process and placed in a cleaning cassette (not shown), and the cleaning cassette (not shown) is carried into the cleaning tank 10. When the cleaning cassette (not shown) has been carried into the cleaning tank 10, a cleaning solution such as pure water is flown into the cleaning tank 10 through the supply line 14.

At this time, the adjusting valves 12-1 and 12-2 hold the switching sections 12*a*-1 and 12*a*-2 in a closed state. Under this condition, the valve 16 is opened to supply the cleaning solution into the cleaning tank 10 through the bypasses 12*b*-1 and 12*b*-2 of the adjusting valves 12-1 and 122 to clean the workpieces.

After the workpieces have been cleaned for a given time under such a condition, the switching section 12*a*-2 of the adjusting valve 12-2 is changed over from the closed state to an open state. This causes a large flow of the cleaning solution to flow into the cleaning tank 10 through the bypass 12*b*-2 and the switching section 12*a*-2 via the bypass 12*b*-1 of the adjusting valve 12-1, thereby cleaning the surfaces of the workpieces.

Further, after cleaning with the large flow for a given time, the switching section 12*a*-1 of the adjusting valve 12-1 is changed over from the closed state to the open state. This causes a further large flow of cleaning solution to be supplied into the cleaning tank 10 through the adjusting valves 12-1 and 12-2 to clean the surfaces of the workpieces.

Thus, in the second embodiment, the workpieces are cleaned with the cleaning solution that is supplied by opening the valve 16 in a first step as shown in FIG. 4. After the cleaning operation of the workpieces has been implemented for the given time in the first step, the switching section 12*a*-2 of the adjusting valves 12-2 is opened in a second step to clean the workpieces. Further, after the cleaning operation of the workpieces has been implemented for a given time in the second step, the switching section 12*a*-1 of the adjusting valves 12-1 is opened in a third step to clean the workpieces. In this manner, the workpieces placed in the cleaning tank 10 can be cleaned with the stream of the cleaning solution which is supplied to the cleaning tank 10 such that it is changed in three steps.

According to the second embodiment, therefore, the workpieces are cleaned with pure water flow in three steps based on lapse of time; hence, the foreign matters on the surfaces of the workpieces can be effectively removed, allowing a shortened cleaning time and a reduced quantity of cleaning solution to be achieved. The second embodiment makes it possible to implement more effective cleaning than that achieved by the first embodiment.

Referring now to FIG. 5 and FIG. 6, a third embodiment of the multi-step flow cleaning method and the multi-step flow cleaning apparatus in accordance with the present invention will be described in detail. FIG. 5 is a piping diagram showing the structure of the third embodiment of the multi-step flow cleaning apparatus in accordance with the present invention. FIG. 6 is a graph illustrating the changes in the flow of a cleaning solution supplied while the multi-step flow cleaning apparatus shown in FIG. 5 is in a cleaning operation. The third embodiment has the same components except for the adjusting valve 12 in the first embodiment, and the same components will be assigned the same reference numerals, and the explanation thereof will not be repeated.

As shown in FIG. 5, the third embodiment of the multi-step flow cleaning apparatus in accordance with the present invention is provided with a cleaning tank 10 for holding workpieces, supply lines 14-1 and 14-2 branched into two in parallel from the bottom of the cleaning tank 10 to respectively supply a cleaning solution such as pure water, and valves 16-1 and 16-2 disposed in the supply lines 14-1 and 14-2, respectively, which are arranged in parallel. The valves 16-1 and 16-2 are provided so that they are electrically turned ON and OFF to open and close the supply lines. The valve 16-2 is provided such that it is able to supply a large flow of the cleaning solution than the valve 16-1 is. Hence, the third embodiment is able to change the flow of the cleaning solution in three steps as time passes by means of the flow supplied through the valve 16-1, the flow supplied through the valve 16-2, and the flow supplied through both valves 16-1 and 16-2 at the same time.

When using the multi-step flow cleaning apparatus in accordance with the present invention configured as described above, first, a plurality of workpieces are taken from a predetermined process and placed in a cleaning cassette (not shown), and the cleaning cassette (not shown) is carried into the cleaning tank 10. When the cleaning cassette (not shown) containing the workpieces therein has been carried into the cleaning tank 10, a cleaning solution such as pure water is flown into the cleaning tank 10.

At this time, the valve 16-2 is held in a closed state. The valve 16-1 is gradually opened from the closed state. This causes the cleaning solution to be supplied into the cleaning tank 10 through the valve 16-1 to clean the workpieces.

After the workpieces have been cleaned for a given time under such a condition, the valve 16-1 is closed, whereas the valve 16-2 is opened from the closed state. This causes the cleaning solution to be supplied into the cleaning tank 10 through the valve 16-2 to clean the workpieces.

Further, after performing the cleaning operation for the given time under such a condition, the valves 16-1 and 16-2 are opened at the same time. This causes a larger flow of the cleaning solution to be supplied into the cleaning tank 10 through the valves 16-1 and 16-2 to clean the workpieces.

Thus, in the third embodiment, the workpieces are cleaned by opening the valve 16-1 in a first step as shown in FIG. 6. After the cleaning operation of the workpieces has been implemented for the given time in the first step, the valve 16-1 is closed, whereas the valve 16-2 is opened in a second step to clean the workpieces. Further, after the cleaning operation of the workpieces has been implemented for a given time in the second step, the valves 16-1 and 16-2 are opened at the same time in a third step to clean the workpieces. In this manner, the workpieces placed in the cleaning tank 10 can be cleaned with the stream of the cleaning solution which is supplied to the cleaning tank 10 such that it is changed in three steps.

According to the third embodiment having the foregoing configuration, the workpieces are cleaned by changing the flow of the cleaning solution in three steps with the lapse of time; hence, the foreign matters on the surfaces of the workpieces can be effectively removed, allowing a shortened cleaning time and a reduced quantity of cleaning solution to be achieved. The third embodiment makes it possible to obtain the same advantage as that obtained by the second embodiment.

Referring now to FIG. 7 and FIG. 8, a fourth embodiment of the multi-step flow cleaning method and the multi-step flow cleaning apparatus in accordance with the present invention will be described in detail. FIG. 7 is a piping diagram showing the structure of the fourth embodiment of the multi-step flow cleaning apparatus in accordance with the present invention. FIG. 8 is a graph illustrating the changes in the flow of a cleaning solution supplied while the multi-step flow cleaning apparatus shown in FIG. 7 is in a cleaning operation. The fourth embodiment has the same components except for the adjusting valve 12 in the first embodiment, and the same components will be assigned the same reference numerals, and the explanation thereof will not be repeated.

As shown in FIG. 7, the fourth embodiment of the multi-step flow cleaning apparatus in accordance with the present invention is provided with a cleaning tank 10 for holding workpieces, a supply line 14 for supplying a cleaning solution such as pure water from the bottom of the cleaning tank 10, a valve 16 disposed in the supply line 14, and a regulator 18 for adjusting the flow of the cleaning solution supplied through the valve 16.

The valve 16 is provided so that it is electrically turned ON and OFF to open and close the supply line. The regulator 18 is provided so that it adjusts the flow of the cleaning solution supplied through the valve 16 by a voltage or pneumatic drive pressure. Therefore, in the fourth embodiment, the flow supplied through the valve 16 can be continuously changed by the regulator 18 as time passes.

When using the multi-step flow cleaning apparatus in accordance with the present invention configured as described above, first, a plurality of workpieces are taken from a predetermined process and placed in a cleaning cassette (not shown), and the cleaning cassette (not shown) is carried into the cleaning tank 10. When the cleaning cassette (not shown) has been carried into the cleaning tank 10, a cleaning solution such as pure water is flown into the cleaning tank 10.

At this time, the valve 16 is held in an opened state, and the regulator 18 is driven to continuously change the flow of the cleaning solution supplied into the cleaning tank 10. This causes the cleaning solution to be supplied into the cleaning tank 10 through the regulator 18 to clean the workpieces.

Thus, in the fourth embodiment, the regulator 18 continuously increases the flow of the cleaning solution when the valve 16 is opened as shown in FIG. 8. The regulator 18 supplies the cleaning solution in a fixed flow after a predetermined time passes. Hence, the workpieces are cleaned with the cleaning solution supplied by the regulator 18 into the cleaning tank 10 in such a manner that they are first cleaned with the stream of the cleaning solution that continuously increases, then cleaned with the fixed flow of the cleaning solution after the predetermined time passes. According to the fourth embodiment having the foregoing configuration, the workpieces are cleaned with the pure water flow that continuously increases as time passes; hence, contaminants on the surfaces of the workpieces can be effectively removed, allowing a shortened cleaning time and a reduced quantity of cleaning solution to be achieved The embodiments of the multi-step flow cleaning method and the multi-step flow cleaning apparatus in accordance with the present invention have been described above. The present invention will now be described in more detail by means of working examples.

Working Examples

FIG. 9 is a graph illustrating an increase in the number of foreign matters observed when a cleaning experiment was carried out with the conventional cleaning apparatus shown in FIG. 11. FIG. 10 is a graph illustrating an increase in the number of foreign matters observed when a cleaning experiment was carried out with the multi-step flow cleaning apparatus shown in FIG. 1.

As shown in FIG. 9, in the cleaning experiment with the conventional cleaning apparatus, workpieces were cleaned with pure water flows of 10 L/min and 30 L/min, respectively, for 10 min., 15 min., and 20 min., respectively.

As illustrated in FIG. 10, in order to compare the multi-step flow cleaning apparatus in accordance with the present invention with the conventional cleaning apparatus, the three different cleaning experiments were carried out with the cleaning apparatus in accordance with the present invention as follows: workpieces were cleaned with a small flow of 10 L/min for 1 min. and a large flow of 30 L/min for 10 min. totaling 11 min.; workpieces were cleaned with a small flow of 10 L/min for 3 min. and with a large flow of 30 L/min for 10 min., totaling 13 min.; and workpieces were cleaned with a small flow of 10 L/min for 10 min. and a large flow of 30 L/min for 10 min., totaling 20 min.

As the workpieces to be cleaned, substrates which are composed of bare silicon substrates sandwiched between silicon substrates coated with oxide silicon films and which are treated with fluorine acid were used. The number of increased foreign matters was calculated as follows: the number of foreign matters adhered to the surfaces of the workpieces was measured before the chemical treatment and after the cleaning process, respectively, and the number of the foreign matters before the chemical treatment was subtracted from the number of the foreign matters after the cleaning process. In the graphs provided in FIG. 9 and FIG. 10, the foreign matters measuring 0.13 to 0.3 $\mu$m are indicated by hatched bars, and the foreign matters measuring 0.3 $\mu$m or more are indicated by blank bars, respectively.

As shown in FIG. 9, it is seen that the conventional cleaning apparatus has a tendency in which the increase of the foreign matters reduces as the treatment time is prolonged in both cases wherein the pure water flows were 10 L/min and 30 L/min, whereas approximately 200 to 1000 pcs. of foreign matters are always left unremoved even after the cleaning was continued for 20 minutes.

On the other hand, in the case of the multi-step flow cleaning apparatus in accordance with the present invention shown in FIG. 10, it is seen that the increase in the number of the foreign matters was controlled to approximately 200 pcs. or less in comparison with the case of the conventional cleaning apparatus, when the cleaning operation was carried out at the small flow for 3 min. and at the large flow for 10 min., totaling 13 minutes.

Therefore, the use of the multi-step flow cleaning method and the multi-step flow cleaning apparatus in accordance with the present invention makes it possible to reduce an increase in the number of foreign matters, shorten the required cleaning time, and to effectively reduce the quantity of a cleaning solution consumed for cleaning.

The multi-step flow cleaning method and the multi-step flow cleaning apparatus made by the present invention have been described in detail. The present invention, however, is not limited to the embodiments discussed above; modifications can be made without departing from the spirit and scope of the present invention.

For instance, the number of the adjusting valves 12 described in the embodiments is not limited to the numbers mentioned in the embodiments; it may be increased as necessary.

Industrial Applicability

Thus, the multi-step flow cleaning method and the multi-step flow cleaning apparatus make it possible to reduce an increase in the number of foreign matters and to accomplish efficient cleaning process by changing intermittently or continuously the flow of pure water supplied during a cleaning process.

What is claimed is:

1. A multi-step flow cleaning method comprising:

placing a workpiece in a cleaning tank;

supplying a cleaning solution to the cleaning tank to clean the workpiece with a stream of the cleaning solution; and adjusting a flow of the cleaning solution to the cleaning tank during a cleaning operation in such a manner that a flow rate is stepwisely increased.

2. The multi-step flow cleaning method according to claim 1, wherein:

the flow rate supplied to the cleaning tank is increased after the workpiece is fully immersed into the cleaning solution.

3. A multi-step flow cleaning method comprising:

placing a workpiece in a cleaning tank;

supplying a cleaning solution to the cleaning tank to clean the workpiece with a stream of the cleaning solution; and adjusting a flow of the cleaning solution supplied to the cleaning tank during a cleaning operation in such a manner that a flow rate is linearly increased and then held constant.

4. The multi-step flow cleaning method according to claim 3, wherein:

the flow rate supplied to the cleaning tank is increased after the workpiece is fully immersed into the cleaning solution.

* * * * *